United States Patent

Omura et al.

Patent Number: 6,069,371
Date of Patent: May 30, 2000

[54] SEMICONDUCTOR RECTIFIER AND A METHOD FOR DRIVING THE SAME

[75] Inventors: Ichiro Omura, Yokohama; Tomoki Inoue, Tokyo, both of Japan

[73] Assignee: Kabushiki Kaisha Toshiba, Kawasaki, Japan

[21] Appl. No.: 09/039,383

[22] Filed: Mar. 16, 1998

[30] Foreign Application Priority Data

Mar. 17, 1997 [JP] Japan .................................... 9-063284

[51] Int. Cl.$^7$ .......................... H01L 29/739; H01L 29/87
[52] U.S. Cl. .......................... 257/133; 257/138; 257/143; 257/212; 257/264; 257/378
[58] Field of Search ..................................... 257/264, 378, 257/212, 133, 143, 138

[56] References Cited

U.S. PATENT DOCUMENTS 5,477,077  12/1995  Kumagai .................................. 257/212

FOREIGN PATENT DOCUMENTS 6-97468   4/1994   Japan .

OTHER PUBLICATIONS

Udrea, *IEEE Electron Device Letters* vol. 17, No. 9 "The MOS . . . Injector" pp 425–427, Sep. 1996.

H.P. Yee, et al., "Channel Diode, a New Fast Switching Power Diode", Proceedings of 1992 International Symposium on Power Semiconductor Devices & ICs, Tokyo, May 19, 1992, pp. 72–79.

*Primary Examiner*—Jerome Jackson, Jr.
*Attorney, Agent, or Firm*—Oblon, Spivak, McClelland, Maier & Neustadt, P.C.

[57] ABSTRACT

A semiconductor rectifier in which the sum of loss during reverse recovery and loss in a conducting state can be suppressed even if the ratio between the periods of the conducting and blocking states varies and a method of driving the same are disclosed. A voltage is applied to a gate electrode formed in a face-to-face relationship with a base layer of a first conductivity type and an emitter layer of a second conductivity type with a gate insulation film interposed therebetween to form an inversion layer on the surface of the base layer of the first conductivity type. As a result, the base layer of the first conductivity type and the short layer of the first conductivity type are short-circuited to decrease the density of carriers in the base layer of the first conductivity type, loss during a reverse recovery operation can be suppressed.

20 Claims, 8 Drawing Sheets

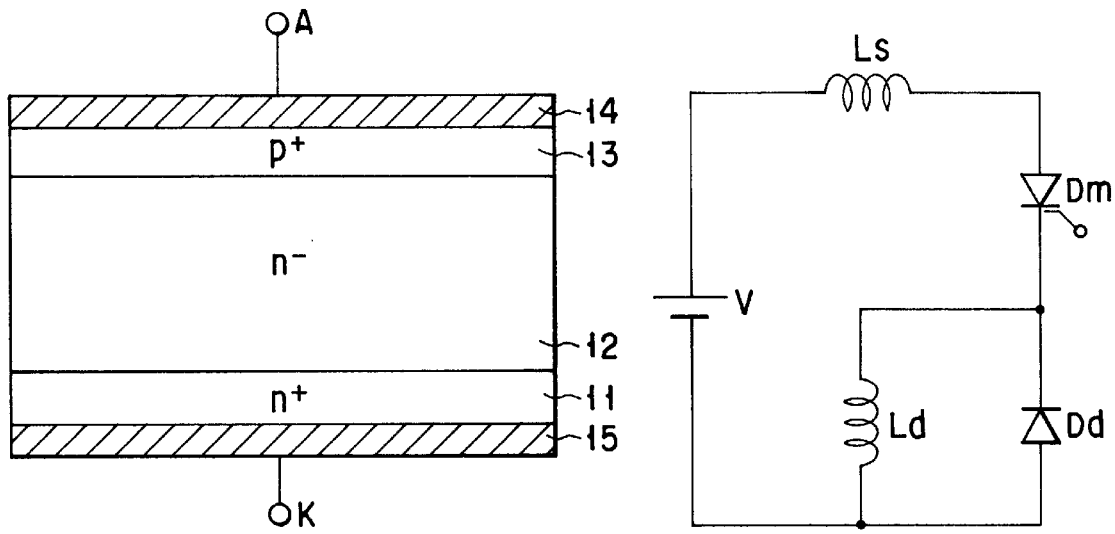
FIG. 1 PRIOR ART
FIG. 2 PRIOR ART
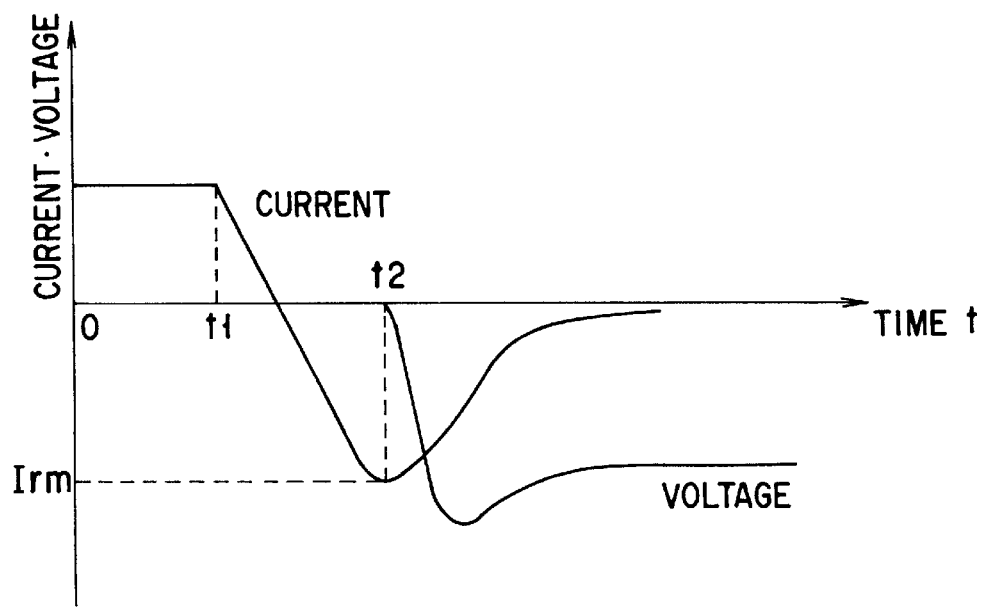
FIG. 3 PRIOR ART

SEMICONDUCTOR RECTIFIER AND A METHOD FOR DRIVING THE SAME

BACKGROUND OF THE INVENTION

1. Field of the Invention

The present invention relates to a semiconductor rectifier and, more particularly, to a semiconductor rectifier suitable as a diode used in inverter circuits, chopper circuits and the like and a method of driving the same.

2. Discussion of the Background

FIG. 1 is a sectional view of a conventional diode having a high blocking voltage showing a configuration of the same. In this high blocking voltage diode, an n-type base layer 12 is formed on an n-type emitter layer 11, and a p-type emitter layer 13 is formed on the n-type base layer 12. An anode 14 is formed on the p-type emitter layer 13. A cathode 15 is formed on the backside of the n-type emitter layer 11.

In a state in which a positive bias relative to the cathode 15 is applied to the anode 14, i.e., in the so-called forward bias state, electrons are injected from the n-type emitter layer 11 into the n-type base layer 12 and holes are injected from the p-type emitter layer 13 into the n-type base layer 12 to put the high blocking voltage diode in a conducting state.

In the conducting state, since the injected electrons and holes are accumulated in the n-type base layer 12, the resistance of the n-type base layer 12 decreases, which also decreases the resistance of the device as a whole.

A description will now be made on a reverse recovery operation that occurs during transition from the conducting state to a blocking state. FIG. 2 is a circuit diagram of a DC chopper circuit illustrating the reverse recovery operation of a diode. Although circuits such as inverter circuits in practical applications are different from this circuit, they encounter the same phenomenon as that in this circuit during the reverse recovery operation. FIG. 3 is a schematic view of voltage and current waveforms of a diode during reverse recovery.

Referring to FIG. 2, the reverse recovery operation means an operation wherein when a switching device Dm is turned on while a forward current If is flowing through a diode Dd, a power supply voltage V is applied to the diode Dd in the reverse direction to cause an abrupt transition of the diode Dd from the conducting state to the blocking state.

As shown in FIG. 3, the switching device Dm is turned on at a point in time t1 at which a diode current Id decreases at a current transition rate di/dt based on the power supply voltage V and stray inductance Ls of the circuit and is increased to a maximum reverse current Irm at a point in time t2.

A depletion layer begins to spread at the junction of the n-type base layer 12 and the p-type emitter layer 13 at the point in time t2, which causes a diode voltage Vd to start to rise. At the same time, the diode current Id flowing in the reverse direction begins to decrease. Thereafter, the diode voltage Vd rises beyond the power supply voltage to reach a maximum value due to the presence of the stray inductance Ls of the circuit and then approaches the power supply voltage. At this time, a flow of a tail current is caused by residual carriers in the vicinity of the cathode.

In a diode having a conventional structure, a large amount of carriers must be accumulated in the n-type base layer 12 in order to reduce loss in the conducting state associated with resistance during conduction. This increases loss during reverse recovery which is given in terms of a value reached by obtaining time-integral of the product of the diode voltage Vd and the diode current Id during reverse recovery.

If the amount of carriers accumulated in the n-type base layer 12 is reduced to reduce the loss during reverse recovery, the loss in the conducting state is increased.

As described above, in a diode having a conventional structure, a design to reduce the loss during reverse recovery results in an increase of the loss in the conducting state, and a design to reduce the loss in the conducting state conversely results in an increase of the loss during reverse recovery. This type of loss characteristics are determined at the phase of designing a diode and are regarded uncontrollable during operation. Therefore, a conventional diode is designed by finding an optimum point on a tradeoff curve such that the sum of the loss during reverse recovery and the loss in the conducting state is minimized.

Although such an optimum design is effective when the ratio between the periods of the conducting and blocking states of the diode is fixed, it is ineffective when the ratio between the periods of the conducting and blocking states varies. The reason is that a change in the ratio between the periods of the conducting and blocking states results in a change in the optimum point on the tradeoff curve.

It is therefore difficult to reduce the sum of the loss during reverse recovery and the loss in the conducting state of a diode where the ratio between the periods of the conducting and blocking states of the diode varies every moment as in the case of a diode used in an inverter circuit, chopper circuit or the like.

As described above, a diode having a conventional structure has a problem in that an increase in the amount of carriers accumulated in the n-type base layer 12 to reduce the loss in the conducting state increases a reverse current that flows upon transition from a forward bias state to a reverse bias state, thereby increasing the loss during reverse recovery.

On the other hand, the problem of an increase of the loss in the conducting state arises when the amount of carriers accumulated in the n-type base layer 12 is reduced to reduce the reverse current in an attempt to reduce the loss during reverse recovery.

Further, even if an optimum design for minimizing the sum of such loss during reverse recovery and loss in the conducting state is attempted, a problem arises in that such a design is difficult to implement in a diode used for an inverter circuit, a chopper circuit or the like in which the period of each of the conducting and blocking states is not fixed.

BRIEF SUMMARY OF THE INVENTION

It is an object of the present invention to provide a semiconductor rectifier in which a reverse current can be reduced without increasing resistance during conduction and a method of driving the same.

More particularly, it is an object of the present invention is to provide a semiconductor rectifier in which the sum of loss during reverse recovery and loss in a conducting state can be made small to suppress loss that occurs in a rectifier even if the ratio between the periods of the conducting and blocking states varies every moment and a method of driving the same.

In order to achieve the above-described object, according to a first aspect of the invention, there is provided a semiconductor rectifier, characterized in that it comprises:

an emitter layer of a first conductivity type;

a base layer of the first conductivity type formed on the emitter layer of the first conductivity type;

an emitter layer of a second conductivity type formed on the surface of the base layer of the first conductivity type;

a short layer of the first conductivity type formed on the surface of the emitter layer of the second conductivity type;

an anode formed in connection to the emitter layer of the second conductivity type and the short layer of the first conductivity type;

a cathode formed in connection to the emitter layer of the first conductivity type; and a gate electrode formed along the emitter layer of the second conductivity type sandwiched by the base layer of the first conductivity type and the short layer of the first conductivity type with an insulation layer interposed therebetween, and in that the base layer of the first conductivity type and the short layer of the first conductivity type are short-circuited by controlling the voltage of the gate electrode when there is a forward bias state between the emitter layer of the second conductivity type and the emitter layer of the first conductivity type to vary the resistance of the base layer of the first conductivity type.

A layer of the second conductivity type having a concentration lower than that of the emitter layer of the second conductivity type may be provided between the base layer of the first conductivity type and the insulation layer.

According to a second aspect of the invention, there is provided a semiconductor rectifier, characterized in that it comprises:

an emitter layer of a first conductivity type;

a base layer of the first conductivity type formed on the emitter layer of the first conductivity type;

an emitter layer of a second conductivity type formed on the surface of the base layer of the first conductivity type;

an anode formed in connection to the emitter layer of the second conductivity type;

a cathode formed in connection to the emitter layer of the first conductivity type; and a gate electrode formed on both of the base layer of the first conductivity type and the emitter layer of the second conductivity type with an insulation layer interposed therebetween.

According to a third aspect of the invention, there is provided a semiconductor rectifier, characterized in that it comprises:

an emitter layer of a first conductivity type;

a base layer of the first conductivity type formed on the emitter layer of the first conductivity type;

an emitter layer of a second conductivity type formed on the surface of the base layer of the first conductivity type;

an anode formed in connection to the emitter layer of the second conductivity type;

a cathode formed in connection to the emitter layer of the first conductivity type;

a trench formed such that it extends from a surface region of the emitter layer of the second conductivity type where the anode is not present into a depth halfway the base layer of the first conductivity type; and a gate electrode buried in the trench with an insulation layer interposed therebetween.

A fourth aspect of the present invention is a method of driving the semiconductor rectifier according to any of the first, second and third aspects of the invention. The method of driving comprises the step of applying a bias voltage at potential which is positive relative to the potential of the emitter layer of the second conductivity type to the gate electrode in a conducting state immediately before starting reverse recovery operation, thereby ejecting carriers in the base layer of the first conductivity type to the anode.

Thus, according to the first aspect of the invention, a voltage is applied to the gate electrode formed in a face-to-face relationship with the base layer of the first conductivity type and the emitter layer of the second conductivity type with the gate insulation film interposed therebetween to form an inversion layer on the surface of the base layer of the first conductivity type. Since this short-circuits the base layer of the first conductivity type and the short layer of the first conductivity type to decrease the density of carriers in the base layer of the first conductivity type, loss during a reverse recovery operation can be suppressed. As a result, even when the ratio between the periods of the conducting and blocking states varies every moment, the sum of loss during the reverse recovery and loss in the conducting state can be suppressed to suppress loss that occurs in the rectifier.

According to the second aspect of the invention, a voltage is applied to the gate electrode formed in a face-to-face relationship with the base layer of the first conductivity type and the emitter layer of the second conductivity type with the gate insulation film interposed therebetween to form an inversion layer on the surface of the base layer of the first conductivity type. Since this makes it substantially possible to expand the area of the emitter layer of the second conductivity type, the injection of carriers of the second conductivity type into the base layer of the first conductivity type can be promoted to increase the density of carriers in the base layer of the first conductivity type and to decrease the resistance of the rectifier.

Meanwhile, the gate electrode may be put in a state wherein no inversion layer is formed on the surface of the base layer of the first conductivity type. This makes it possible to suppress the injection of carriers of the second conductivity type into the base layer of the first conductivity type. As a result, the density of carriers in the base layer of the first conductivity type can be decreased to suppress loss during reverse recovery.

As described above, by varying the voltage of the insulated gate to suppress each of loss in the conducting state and loss during reverse recovery.

According to the third aspect of the invention, a trench structure provides the same affect as that of the second aspect.

Further, according to the fourth aspect of the invention, a method of driving can be realized which makes it possible to suppress loss during a reverse recovery operation of semiconductor rectifiers according to the first through third aspects.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF DRAWING

The accompanying drawings, which are incorporated in and constitute a part of the specification, illustrated presently preferred embodiments of the present invention and, together with the general description given above and the detailed description of the preferred embodiments given below, serve to explain the principles of the present invention.

FIG. 1 is a sectional view of a conventional diode having a high blocking voltage showing a configuration thereof;

FIG. 2 is a circuit diagram of a common DC chopper circuit for illustrating a reverse recovery operation of a conventional diode;

FIG. 3 is a schematic view of voltage and current waveforms of a diode during reverse recovery according to the prior art;

DETAILED DESCRIPTION OF THE INVENTION

Figure 4:
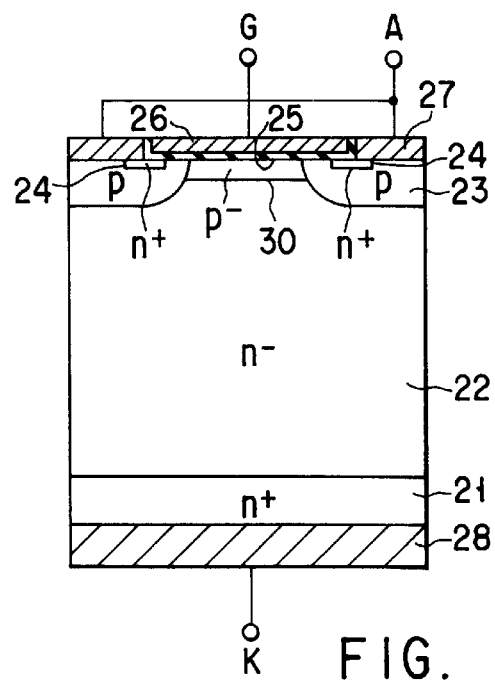
FIG. 4 is a sectional view of a rectifier according to a first embodiment of the invention showing a configuration thereof.

Preferred embodiments of the present invention will now be described with reference to the accompanying drawings.
First Embodiment FIG. 4 is a sectional view of a rectifier according to the first embodiment of the invention showing a configuration thereof. In this rectifier, an n-type base layer 22 is formed on an n-type emitter layer 21; a p-type emitter layer 23 is selectively formed on the surface of the n-type base layer 22; and an n-type short layer 24 is selectively formed on the surface of the p-type emitter layer 23. A gate electrode 26 is formed on the surface of the n-type base layer 22 and the p-type emitter layer 23 with a gate insulation film 25 interposed therebetween. An anode 27 is formed in contact with both of the p-type emitter layer 23 and the n-type short layer 24, and a cathode 28 is formed in contact with the n-type emitter layer 21.

A p-type layer 30 having a concentration lower than that of the p-type emitter layer 23 may be provided between the n-type base layer 22 and the gate insulation film 25.

The operation of such a rectifier will now be described.

Let us assume that a negative bias which is negative relative to the p-type emitter layer 23 is applied to the gate electrode 26.

Figure 5:
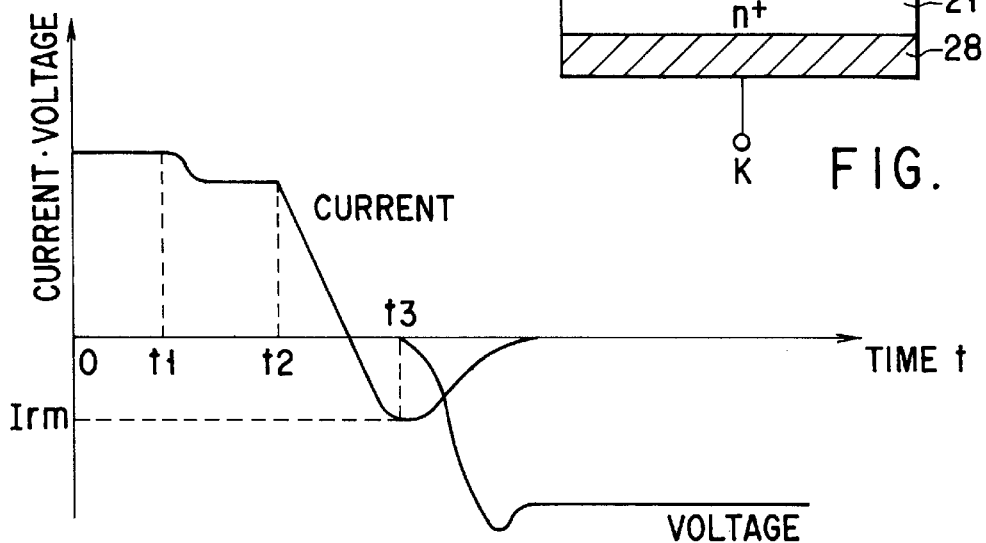
FIG. 5 is a time chart illustrating the operation of the first embodiment.

When a positive bias which is positive relative to the cathode 28 is applied to the anode 27 in this state, electrons are injected from the n-type emitter layer 21 into the n-type base layer 22, and holes are injected from the p-type emitter layer 23 into the n-type base layer 22. At this time, the n-type base layer 22 enters a high injection state in which the resistance thereof is decreased, and the rectifier enters a conducting state as at the point in time t=0 in FIG. 5.

Figure 6:
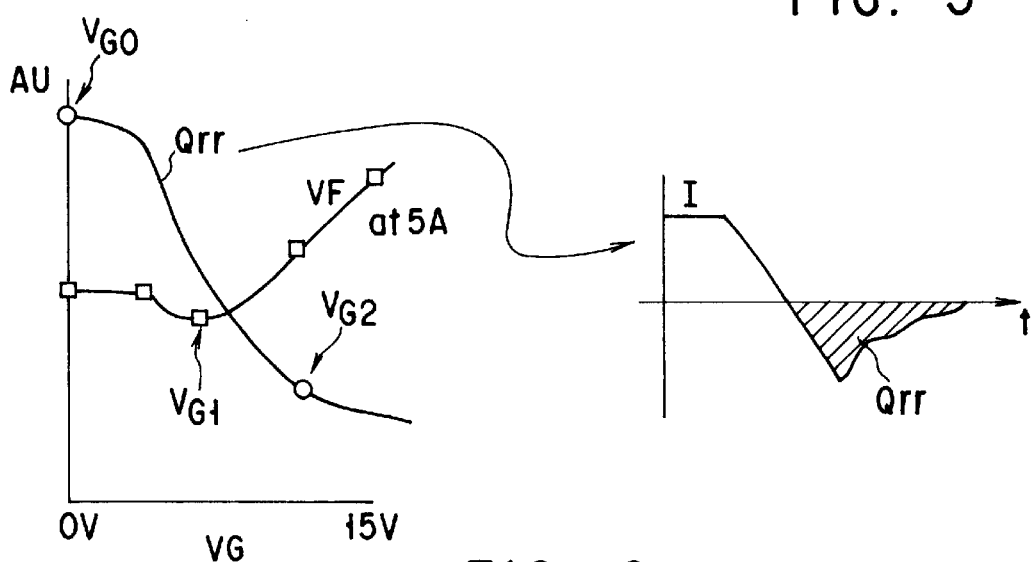
FIG. 6 is a diagram illustrating the relationship between the gate voltage and diode characteristics of a rectifier of the first embodiment.

When a positive bias which is positive relative to the p-type emitter 23 is applied to the gate electrode 26 in this conducting state (point in time t1), an inversion layer is formed in the p-type emitter layer 23 directly below the gate insulation film 25, and the n-type base layer 22 and the n-type short layer 24 is short-circuited through this inversion layer. Since this causes electrons in the n-type base layer 22 to flow through the n-type short layer 24 into the anode 27, the amount of carriers accumulated in the n-type base layer 22 is decreased. When a reverse recovery operation takes place in this state (point in time t2), since the amount of accumulated carries is small, a reverse maximum current Irm becomes smaller than that in the prior art (point in time t=t3) to reduce the loss during the reverse recovery.
Optimization of Gate Voltage A description will now be made on gate voltages which are preferable in the conducting state at the time of energization and reverse recovery of the rectifier according to the invention. FIG. 6 is a diagram showing the relationship between the gate voltage and diode characteristics of such a rectifier. As illustrated, when a gate voltage VG is increased, loss Vf in the conducting state is temporarily decreased and is increased again. The total amount of charges that flow in the reverse direction during reverse recovery (Qrr) is uniformly decreased as the gate voltage VG is increased. Therefore, by setting the gate voltage at a value indicated by "VG1" in FIG. 6 during a major part of the period of the conducting state of the diode and at a value indicated by "VG2" in FIG. 6 before the reverse recovery, Qrr can be decreased to obtain preferable reverse recovery characteristics. Such control over the potential of the insulated gate makes it possible to reduce both of loss in the conducting state and loss during the reverse recovery.

Figure 7:
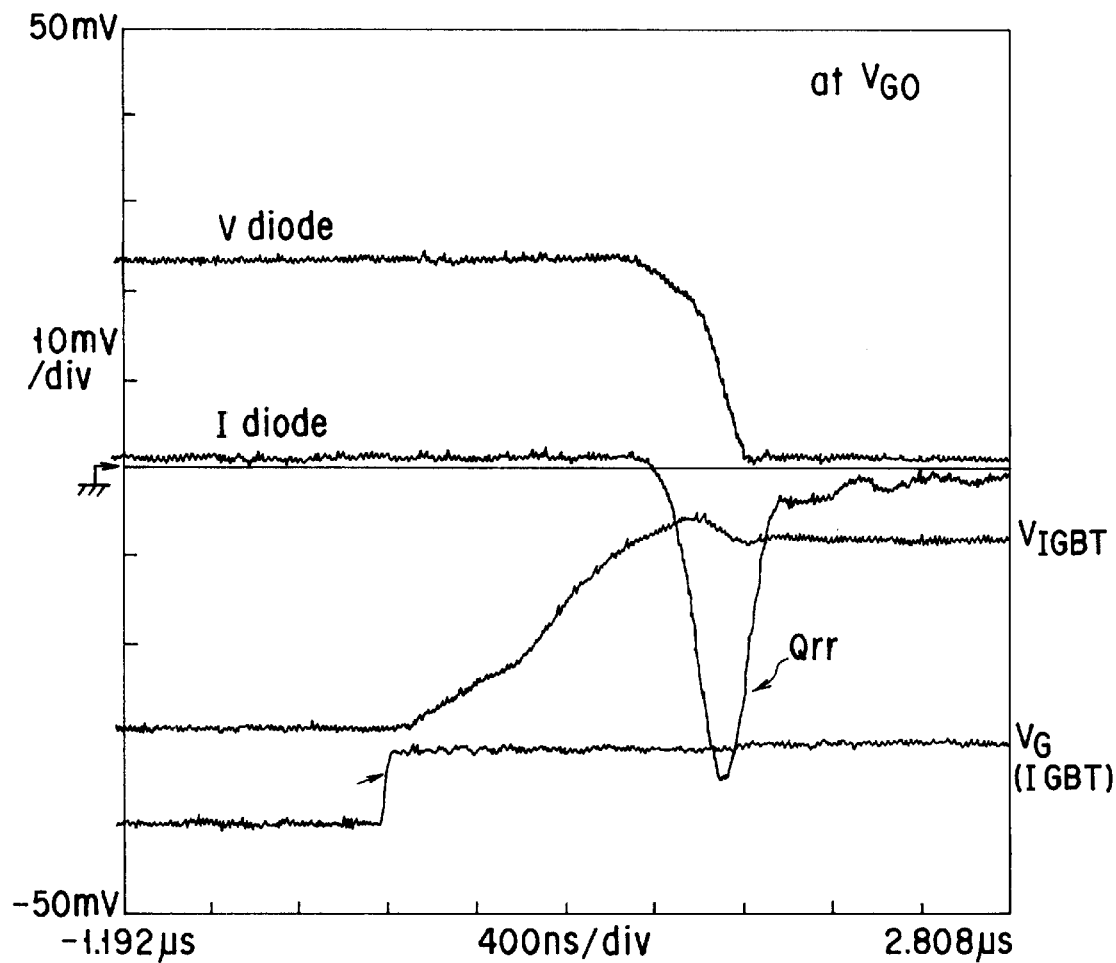
FIG. 7 is a diagram showing different reverse recovery characteristics attributable to different gate voltages in the first embodiment in the form of experimental waveforms.
Figure 8:
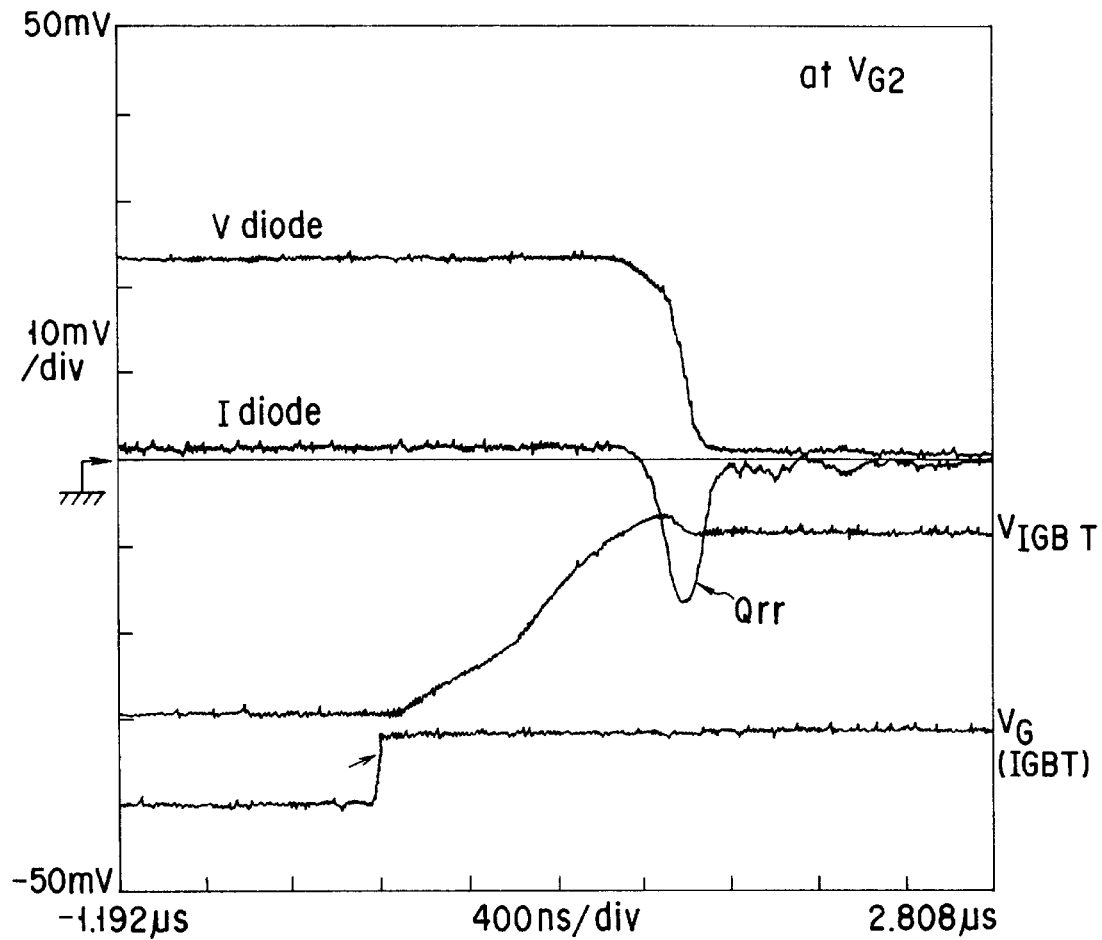
FIG. 8 is a diagram showing different reverse recovery characteristics attributable to different gate voltages in the first embodiment in the form of experimental waveforms.

FIGS. 7 and 8 are diagrams showing different reverse recovery characteristics attributable to different gate voltages in the rectifier according to the invention in the form of experimental waveforms. FIG. 7 shows waveforms measured in a state wherein the gate voltage is at VG0 in FIG. 6. FIG. 8 shows waveforms measured in a state wherein the gate voltage is at VG2 in FIG. 6. In the conducting state, the gate voltage is at VG0 in both of FIGS. 7 and 8. The gate voltage before the reverse recovery is at VG0 in FIG. 7 and at VG2 in FIG. 8.

Calculations of Qrr from those values has revealed that the Qrr of the waveform shown in FIG. 7 is three times greater than the Qrr of the waveform shown in FIG. 8. That is, with the rectifier according to the invention, Qrr can be reduced to one-third of that in the prior art by setting an optimum gate electrode.

Method of Driving Inverter

Figure 9:
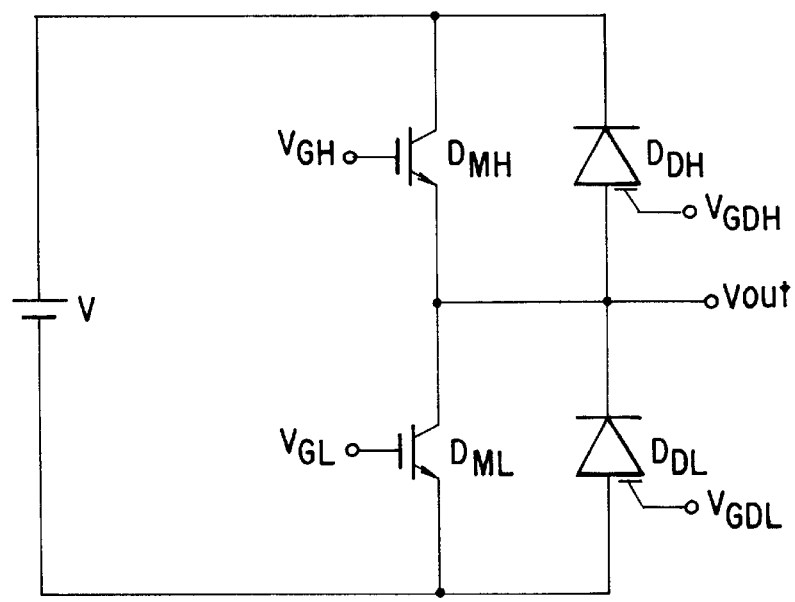
FIG. 9 is a circuit diagram illustrating a single arm configuration of an inverter of the first embodiment.
Figure 10:
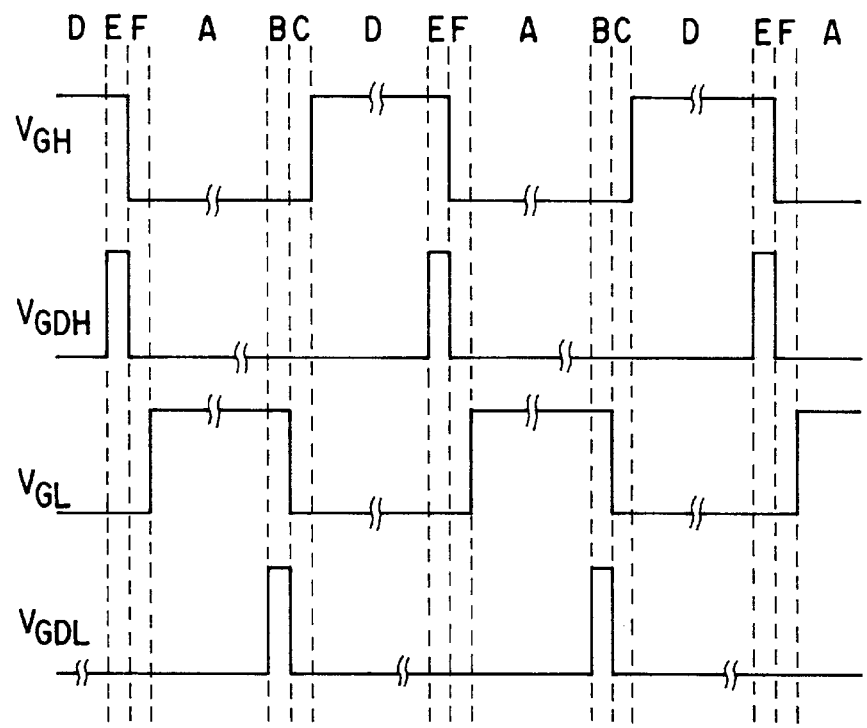
FIG. 10 is a timing chart for gate voltages applied to main elements in the circuit shown in FIG. 9 and a rectifier according to the invention.

A description will now be made on an application of such a rectifier according to the invention to an inverter. FIG. 9 is a circuit diagram of a single arm configuration of an inverter wherein the rectifier according to the invention is used. FIG. 10 is a timing chart of gate voltages applied to switching devices (IGBT) and the rectifier according to the invention in the circuit shown in FIG. 9. In FIG. 10, the potential of an output terminal Vout is at a power supply voltage V during periods D and E and at 0 during periods A and B. While periods C and F for preventing short-circuit may be deleted in an idealistic switching element whose turn off time is 0, the periods C and F must be provided in practice depending on the turn off time of switching devices.

When a load current (current at the output terminal Vout) is in the direction of exiting from the output terminal Vout, the current flow only through a switching device DMH of a positive arm and a diode DDL of a negative arm, and no current flows through a diode DDH of the positive arm and a switching device DML of the negative arm. Thus, the circuit configuration is equivalent to that of the DC chopper circuit shown in FIG. 2. In this case, the period A corresponds to the period between the points in time 0 and t1, and the period B corresponds to the period between the points t1 and t2. In this case, the current in the reverse direction is decreased as in FIG. 5 to reduce loss in the circuit as a whole.

In the case of a load current flowing in the output terminal Vout, the current flows through only the diode DDH of the positive arm and the switching device DML of the negative arm to produce a state which is the reverse of that described above. Since this state is equivalent to a state that the DC chopper circuit shown in FIG. 2 enters when the polarity of its power supply voltage is reversed, loss in the circuit as a whole is reduced similarly to the case described above. The on-periods of the gate of a rectifier as represented by the periods E and B in FIG. 10 are preferably within the range from 7 to 100 $\mu$s for a device having a blocking voltage of 4.5 kV, within the range from 5 to 30 $\mu$s for a device having a blocking voltage of 2 kV, within the range from 2 to 15 $\mu$s for a device having a blocking voltage of 1.2 kV, and within the range from 0.5 to 10 $\mu$s for a device having a blocking voltage of 600 V.

Modification to the Method of Driving

Figure 11:
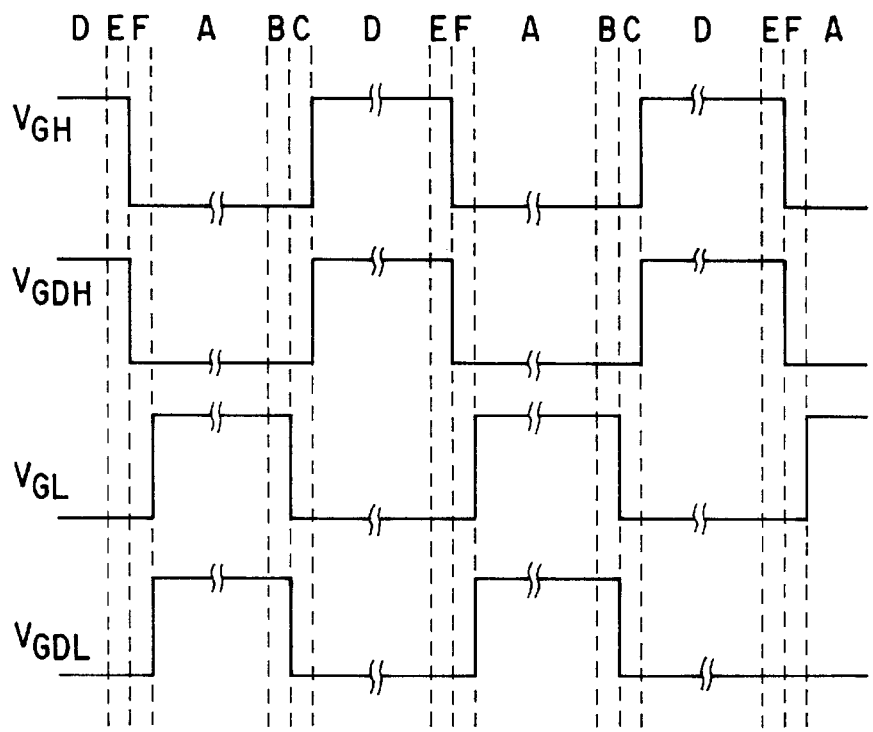
FIG. 11 is a timing chart for gate voltages as a modification to the first embodiment.

The rectifier according to the first embodiment may be driven according to, for example, the timing chart shown in FIG. 11. The timing chart in FIG. 11 is different from that shown in FIG. 10 in that the gates of the switching device and rectifier of each of the positive and negative arms are driven for switching at the same timing. The time chart shown in FIG. 11 includes the periods C and F for preventing short-circuit like FIG. 10.

When the gates are driven according to the time chart shown in FIG. 11, loss in the circuit as a whole can be reduced again because Qrr can be suppressed by setting the gate voltage for the rectifier in the conducting state at a gate voltage which is an optimum point of tradeoff between Qrr and Vf in FIG. 6.

As described above, according to the present embodiment, a positive bias is applied to the gate electrode 26 formed in a face-to-face relationship with the n-type base layer 22 and the p-type emitter layer 23 with the gate insulation film 25 interposed therebetween. Thus, the n-type base layer 22 and the n-type short layer 24 are short-circuited to decrease the density of carriers in the n-type base layer 22, which suppresses loss during the reverse recovery operation.

It is therefore possible to suppress the sum of loss during the reverse recovery and loss in the conducting state even when the ratio between the periods of conducting and blocking states varies every moment, thereby suppressing loss that occurs in the rectifier to achieve an optimum state of rectification.

Second Embodiment

Figure 12:
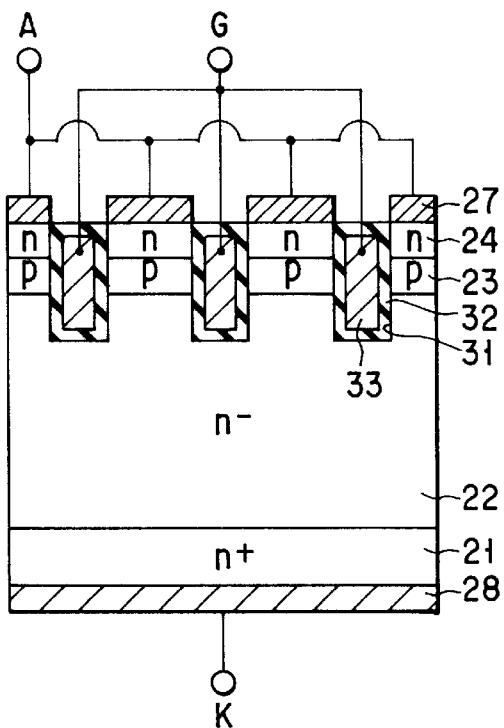
FIG. 12 is a sectional view of a rectifier according to a second embodiment of the invention showing a configuration thereof.

FIG. 12 is a sectional view of a rectifier according to the second embodiment of the invention showing a configuration thereof in which parts identical to those in FIG. 4 are indicated by like reference numbers, and the following description will omit those parts and address different parts only.

The rectifier is different from a planar structure in FIG. 4 and it is realized by the a trench structure. Specifically, as shown in FIG. 12, instead of providing the n-type short layer 24, gate insulation film 25 and gate electrode 26, a trench 31 is formed that penetrates through the p-type emitter layer 23 into a depth halfway the n-type base layer 22, and a gate electrode 33 is formed in the trench 31 with a gate insulation film 32 interposed therebetween. Although not shown, the p-type emitter layer 23 and the anode 27 are obviously in contact with each other in some position in the direction perpendicular to the plane of the drawing.

In the above-described configuration, when a positive bias which is positive relative to the p-type emitter layer 23 is applied to the gate electrode 33 before a reverse recovery operation, an n-type inversion layer (not shown) is produced in contact with the p-type emitter layer 23 of the trench 31 and, therefore, the n-type base layer 22 and the anode 27 are short-circuited again in this case through the inversion layer.

Specifically, since electrons in the n-type base layer 22 flow through the inversion layer to the anode 27 as in the case described above, the amount of carriers accumulated in the n-type base layer 22 can be controlled such that it is reduced. This suppresses loss during reverse recovery to provide the same effect as that in the first embodiment.

Third Embodiment

Figure 13:
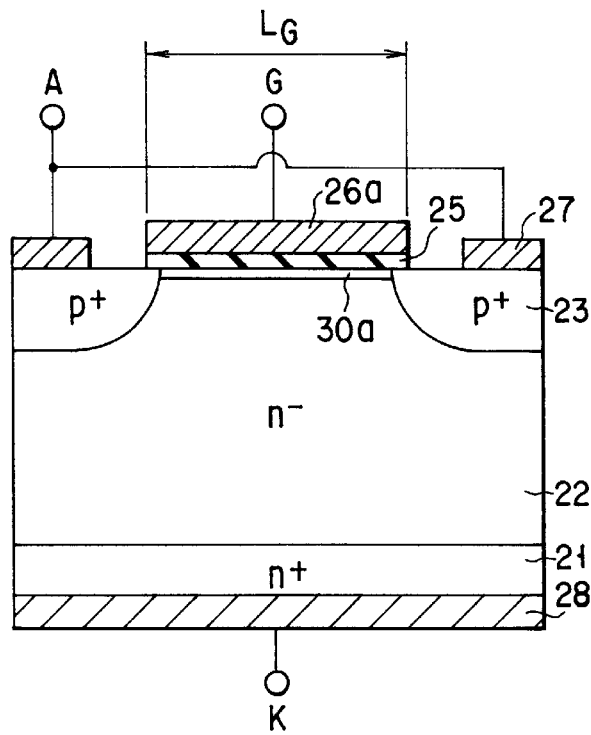
FIG. 13 is a sectional view of a rectifier according to a third embodiment of the invention showing a configuration thereof.

FIG. 13 is a sectional view of a rectifier according to the third embodiment of the invention showing a configuration thereof which is a modification to the configuration shown in FIG. 4 although operates differently.

In the present embodiment, a p-type inversion layer 30a having a controllable area in connection to the p-type emitter layer 23 is used to control the amount of accumulated carriers. Specifically, in this configuration, the n-type short layer 24 is deleted and the width LG of the gate electrode 26a is expanded in an amount corresponding to the deleted part.

The gate electrode 26a is formed on a region which extends from the end of the p-type emitter layer 23 on one side through the surface of the p-type base layer 22 to the p-type emitter layer 23 on the other side with the gate insulation film 25 interposed therebetween.

The average concentration of the p-type emitter layer 23 is preferably $1 \times 10^{18} \text{cm}^{-3}$ or less in order to suppress the amount of carriers accumulated in the p-type emitter layer 23 in the n-type base layer 22 in a low accumulation state. The width LG of the gate electrode 26a preferably set at 12 $\mu$m or more as another means for this purpose.

The operation of such a rectifier will now be described.

Like the above-described case, when a positive bias which is positive relative to the cathode 28 is applied to the anode 27, electrons from the n-type emitter layer 21 and holes from p-type emitter layer 23 are injected into the n-type base layer 22. As a result, the n-type base layer 22 enters a high injection state in which it has low resistance, and the rectifier enters the conducting state.

If a negative bias which is negative relative to the p-type emitter layer 23 is applied to the gate electrode 26a at this time, a p-type inversion layer 30a is formed directly under the gate insulation film 25 to substantially increase the area of the p-type emitter layer 23. This enhances the capability of injecting holes from the p-type emitter layer 23 into the n-type base layer 22 and makes it possible to increase the amount of carriers accumulated in the n-type base layer 22, especially in the p-type emitter layer 23 (referred to as "high accumulation state").

When a zero bias or positive bias relative to the p-type emitter layer 23 is then applied to the gate electrode 26a, the p-type inversion layer 30a is annihilated to reduce the amount of carriers accumulated in the p-type emitter layer 23 in the n-type base layer 22 (hereinafter referred to as "low accumulation state").

Loss during reverse recovery can be suppressed by causing the reverse recovery operation, i.e., applying a negative bias which is negative relative to the cathode 28 to the anode 27 in this low accumulation state. The specific timing for driving the gate is as shown in the time chart in FIG. 11.

As described above, according to the present embodiment, the amount of accumulated carriers is controlled by controlling the substantial area of the p-type emitter layer 23 through the application of the bias voltage to the gate electrode 26a. Thus, the same effect as that in the first embodiment can be achieved, although the details of the operation is different from those in the first embodiment.

Specifically, by applying a negative bias to the gate electrode 26a formed in a face-to-face relationship with the n-type base layer 22 and the p-type emitter layer 23 with the gate insulation film 25, the area of the p-type emitter layer 23 can be substantially increased to promote the injection of p-type carriers into the n-type base layer 22. Thus, the density of carriers in the n-type base layer 22 is increased to decrease the resistance of the rectifier.

Meanwhile, by applying a zero bias or positive bias to the gate electrode 26a, the injection of p-type carriers into the n-type base layer 22 can be suppressed. This makes it possible to decrease the density of carriers in the n-type base layer 22 to suppress loss during reverse recovery.

As described above, loss in the conducting state and loss during reverse recovery can be suppressed by varying the voltage at the insulated gate.

Fourth Embodiment

Figure 14:
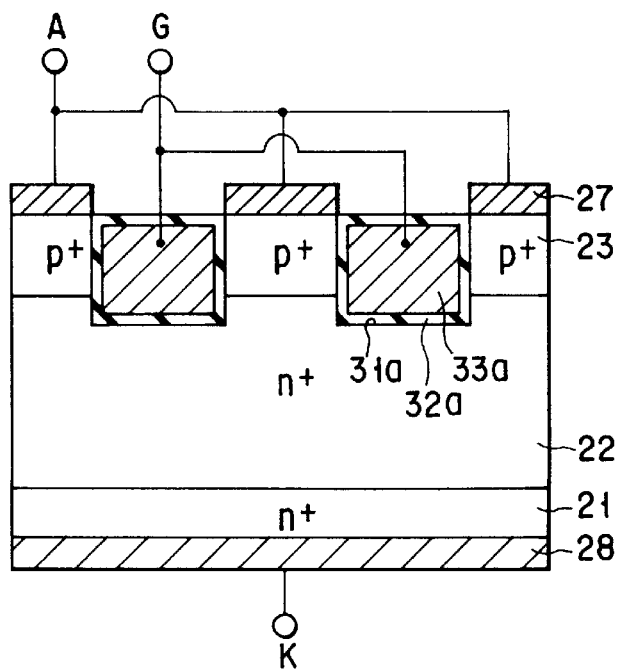
FIG. 14 is a sectional view of a rectifier according to a fourth embodiment of the invention showing a configuration thereof.

FIG. 14 is a sectional view of a rectifier according to the fourth embodiment of the invention showing a configuration thereof which is a modification to the configuration shown in FIG. 13.

This rectifier is implemented using a trench structure instead of the planar structure shown in FIG. 13. Specifically, as shown in FIG. 14, instead of providing the gate insulation film 25 and gate electrode 26a, a trench 31a is formed that penetrates through the p-type emitter layer 23 into a depth halfway the n-type base layer 22, and a gate electrode 33a is formed in the trench 31a with a gate insulation film 32a interposed therebetween.

When a negative bias which is negative relative to the p-type emitter layer 23 is applied to the gate electrode 33a before a reverse recovery operation, a p-type inversion layer (not shown) is produced in the n-type base layer 22 along the region of the trench 31a which protrudes into the n-type base layer 22. Since the area of the p-type emitter layer 23 can be thus increased substantially, the present embodiment provides the same effect as that of the third embodiment.

Fifth Embodiment

Figure 15:
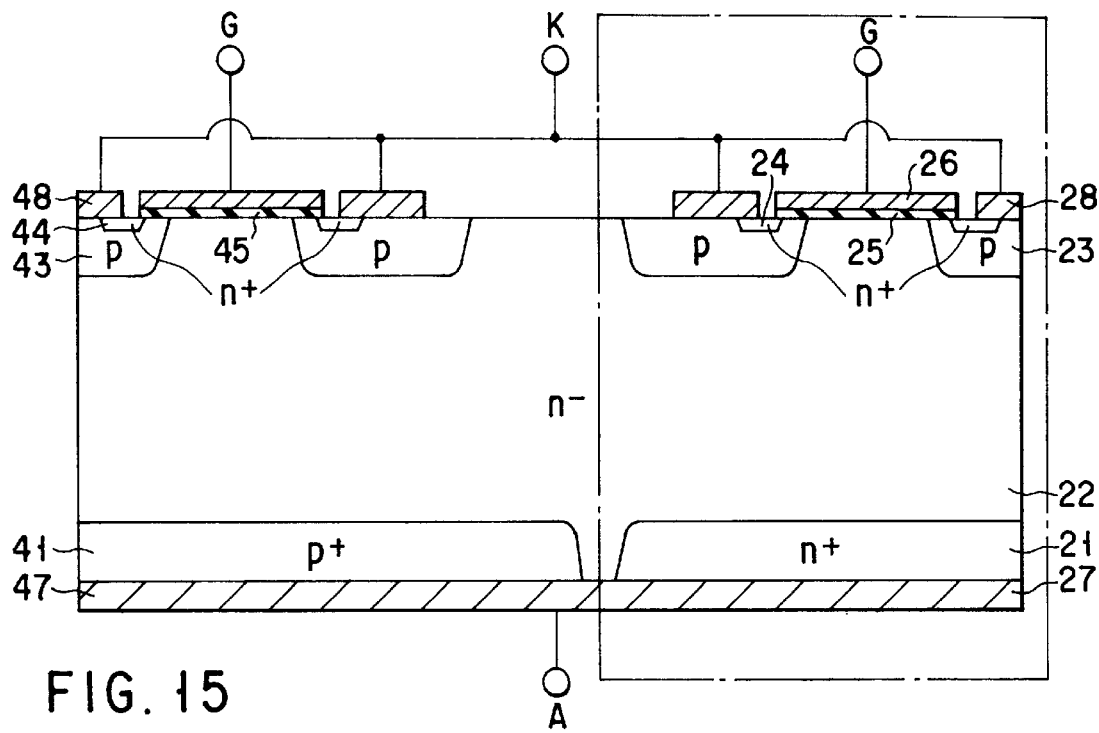
FIG. 15 is a sectional view showing a configuration of a semiconductor device including a rectifying element according to a fifth embodiment of the invention.

FIG. 15 is a sectional view of a rectifying element according to the fifth embodiment of the invention showing a configuration thereof. This semiconductor device is has a configuration wherein a switching element and a rectifing element according to the first embodiment are formed integrally on the same semiconductor substrate.

In the switching element, a p-type emitter layer 41 is selectively formed on the backside of an n-type base layer 22, and a p-type base layer 43 is selectively formed in the front side of the n-type base layer 22. An n-type emitter layer 44 is selectively formed in the p-type base layer 43.

A gate electrode 46 is formed on a surface region which extends from a part of the surface of the n-type emitter layer 44 on one side through a part of the surface of the p-type base layer 43 and the surface of the n-type base layer 22 to a part of the surface of the p-type base layer 43 and a part of the surface of the n-type emitter layer 44 on the other side with the gate insulation film 45 interposed therebetween. An anode 47 is formed in contact with the p-type emitter layer 41, and a cathode 48 is formed in contact with the n-type emitter layer 44 and the p-type base layer 43. This is a configuration in which the switching element is an IGBT.

Since the rectifying element has the same configuration as in the first embodiment for which detailed description will be omitted and is illustrated within the area in the alternate long and short dash lines in FIG. 15. Since the rectifying element is connected to the main element in the reverse conduction, the positions of the cathode 28 and anode 27 are switched.

The p-type base layer 23 of the main element and the p-type emitter layer 43 of the rectifying element are formed at a sufficient interval from each other to prevent them from interfering with each other.

The above-described configuration allows various circuits to be made compact with improved reliability in addition to the effect as that of the first embodiment because electronic circuits such as the arm configuration of the above-described inverter circuit can be integrally provided on the same substrate.

Figure 16:
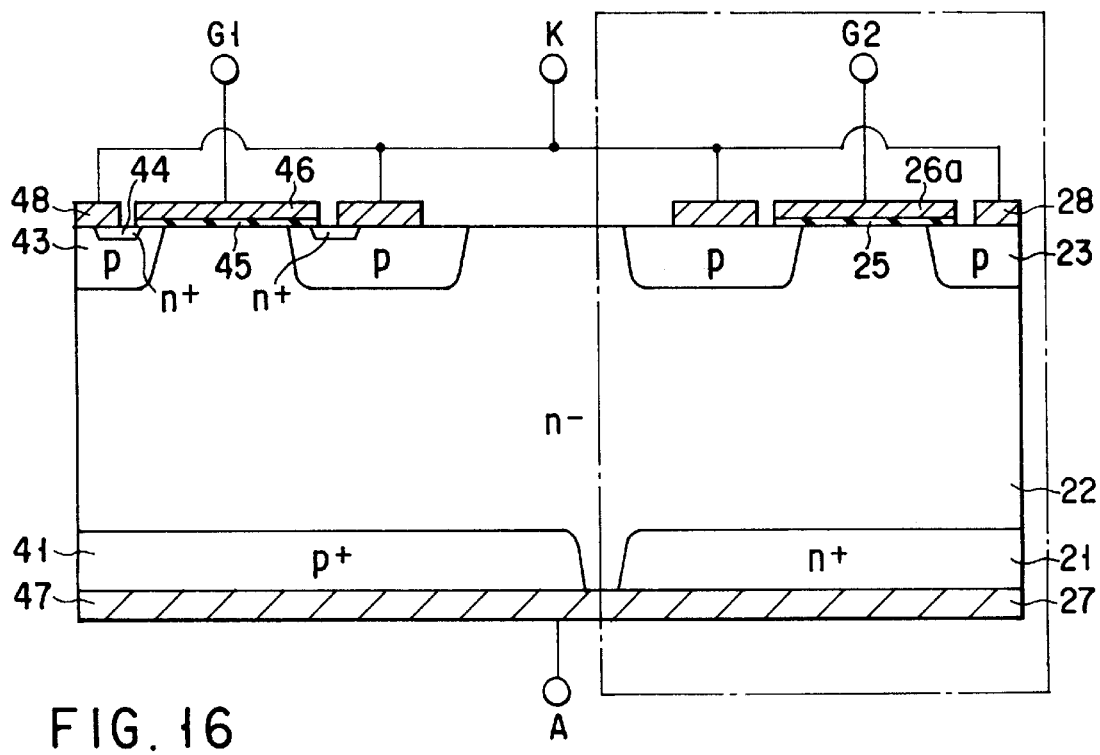
FIG. 16 is a sectional view of a modified configuration of the fifth embodiment of the invention.

Further, the present embodiment may be modified such that a switching element and a rectifying element according to the third embodiment are formed integrally on the same substrate as shown in FIG. 16, which provides the effects achieved in the third and fifth embodiments simultaneously.

Sixth Embodiment

Figure 17:
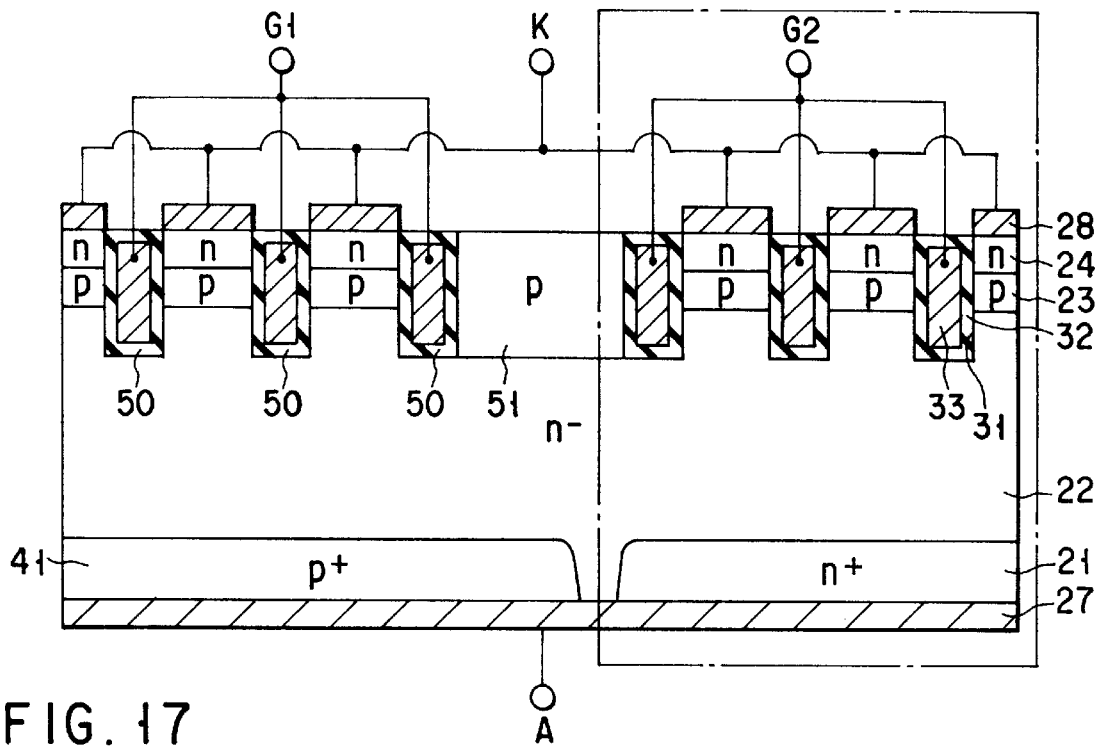
FIG. 17 is a sectional view showing a configuration of a semiconductor device including a rectifying element according to a sixth embodiment of the invention.

FIG. 17 is a sectional view showing a configuration of a semiconductor device including a rectifying element according to the sixth embodiment of the invention. This semiconductor device has a configuration wherein a switching element and a rectifying element according to the second embodiment are integrally formed on the same substrate in a reverse-conducting relationship with each other. The switching element is a trench type IGBT (IEGT) in a configuration substantially similar to the second embodiment, and a p-type emitter layer 41 is provided instead of the n-type emitter layer 21.

A p-type ring layer 51 at a high concentration is formed in the region between a trench 50 of the switching element and a trench 31 of the rectifying element to a depth which is about the same as that of the trench 31.

The p-type ring layer 51 serves as a guard ring for preventing the switching element and rectifying element from interfering with each other.

Such a configuration also provides the same effects as those of the second and fifth embodiments.

Figure 18:
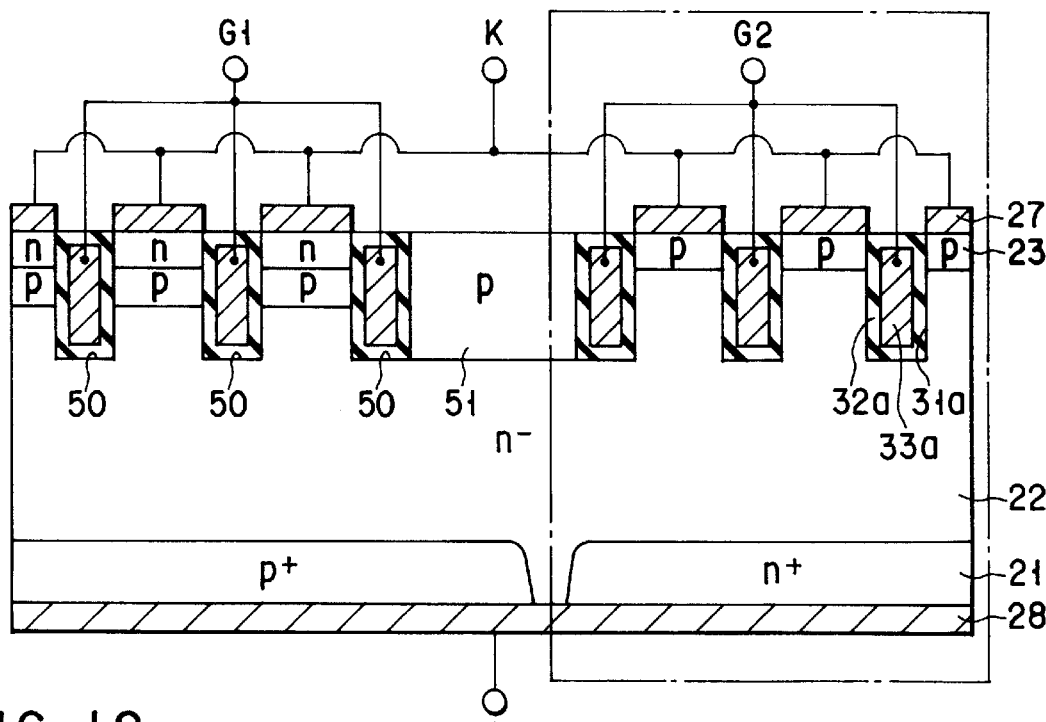
FIG. 18 is a sectional view of a modified configuration of the sixth embodiment of the invention.

Further, the present embodiment may be modified such that the switching element and a rectifying element according to the fourth embodiments are integrally formed on the same substrate as shown in FIG. 18, which provides the effects of the fourth and sixth embodiment at the same time.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirits or scope of the general inventive concept as defined by the appended claims and their equivalents.

For example, although the fifth and sixth embodiments of the invention were described as including an IGBT (or an IEGT) as the switching element, the main element is not limited to an IGBT, and those embodiments may be appropriately applied to any element which is capable of self-extinction to provide the same effect.

What is claimed is:

1. A method of driving a semiconductor rectifier comprising:

an emitter layer of a first conductivity type;

a base layer of the first conductivity type formed on said emitter layer of the first conductivity type;

an emitter layer of a second conductivity type formed on the surface of said base layer of the first conductivity type;

a short layer of the first conductivity type formed on the surface of said emitter layer of the second conductivity type;

an anode formed in connection to said emitter layer of the second conductivity type and said short layer of the first conductivity type;

a cathode formed in connection to said emitter layer of the first conductivity type; and a gate electrode formed along said emitter layer of the second conductivity type sandwiched by said base layer of the first conductivity type and said short layer of the first conductivity type with an insulation layer interposed therebetween, said method comprising the step of increasing a gate voltage by applying a bias voltage at a potential, which is positive relative to the potential of said emitter layer of the second conductivity type, to said gate electrode in a conducting state before starting a reverse recovery operation, thereby ejecting carriers in said base layer of the first conductivity type to said anode.

2. The method of driving a semiconductor rectifier according to claim 1, wherein: a layer of the second conductivity type having a concentration lower than that of said emitter layer of the second conductivity type is provided between said base layer of the first conductivity type and said insulation layer.

3. A method of driving a semiconductor rectifier comprising:

an emitter layer of a first conductivity type;

a base layer of the first conductivity type formed on said emitter layer of the first conductivity type;

an emitter layer of a second conductivity type selectively formed on the surface of said base layer of the first conductivity type;

an anode formed in connection to said emitter layer of the second conductivity type;

a cathode formed in connection to said emitter layer of the first conductivity type; and a gate electrode formed on both of said base layer of the first conductivity type and said emitter layer of the second conductivity type with an insulation layer interposed therebetween, said method comprising the step of increasing a gate voltage by applying a bias voltage at a potential, which is zero or positive relative to the potential of said emitter layer of the second conductivity type, to said gate electrode in a conducting state before starting a reverse recovery operation, thereby ejecting carriers in said base layer of the first conductivity type to said anode.

4. A method of driving a semiconductor rectifier comprising:

an emitter layer of a first conductivity type;

a base layer of the first conductivity type formed on said emitter layer of the first conductivity type;

an emitter layer of a second conductivity type formed on the surface of said base layer of the first conductivity type;

an anode formed in connection to said emitter layer of the second conductivity type;

a cathode formed in connection to said emitter layer of the first conductivity type;

a trench extending from a surface of said emitter layer of the second conductivity type into said base layer of the first conductivity type;

a gate electrode formed on said emitter layer of the second conductivity type; and an insulation layer, wherein said gate electrode is buried in said trench with said insulation layer interposed therebetween, said method comprising the step of increasing a gate voltage by applying a bias voltage at a potential, which is zero or positive relative to the potential of said emitter layer of the second conductivity type, to said gate electrode in a conducting state before starting a reverse recovery operation, thereby ejecting carriers in said base layer of the first conductivity type to said anode.

5. The method of driving a semiconductor device according to claim 1, wherein:

a period of applying the bias voltage is within the range from 7 to 100 $\mu$s for said semiconductor device having a blocking voltage of 4.5 kV.

6. The method of driving a semiconductor device according to claim 1 wherein:

a period of applying the bias voltage is within the range from 5 to 30 $\mu$s for said semiconductor device having a blocking voltage of 2 kV.

7. The method of driving a semiconductor device according to claim 1 wherein:

a period of applying the bias voltage is within the range from 2 to 15 $\mu$s for said semiconductor device having a blocking voltage of 1.2 kV.

8. The method of driving a semiconductor device according to claim 1 wherein:

a period of applying the bias voltage is within the range from 0.5 to 10 $\mu$s for said semiconductor device having a blocking voltage of 600 V.

9. The method of driving a semiconductor device according to claim 2 wherein:

a period of applying the bias voltage is within the range from 7 to 100 μs for said semiconductor device having a blocking voltage of 4.5 kV.

10. The method of driving a semiconductor device according to claim 2 wherein:

a period of applying the bias voltage is within the range from 5 to 30 μs for said semiconductor device having a blocking voltage of 2 kV.

11. The method of driving a semiconductor device according to claim 2 wherein:

a period of applying the bias voltage is within the range from 2 to 15 μs for said semiconductor device having a blocking voltage of 1.2 kV.

12. The method of driving a semiconductor device according to claim 2 wherein:

a period of applying the bias voltage is within the range from 0.5 to 10 μs for said semiconductor device having a blocking voltage of 600 V.

13. The method of driving a semiconductor device according to claim 3 wherein:

a period of applying the bias voltage is within the range from 7 to 100 μs for said semiconductor device having a blocking voltage of 4.5 kV.

14. The method of driving a semiconductor device according to claim 3 wherein:

a period of applying the bias voltage is within the range from 5 to 30 μs for said semiconductor device having a blocking voltage of 2 kV.

15. The method of driving a semiconductor device according to claim 3 wherein:

a period of applying the bias voltage is within the range from 2 to 15 μs for said semiconductor device having a blocking voltage of 1.2 kV.

16. The method of driving a semiconductor device according to claim 3 wherein:

a period of applying the bias voltage is within the range from 0.5 to 10 μs for said semiconductor device having a blocking voltage of 600 V.

17. The method of driving a semiconductor device according to claim 4 wherein:

a period of applying the bias voltage is within the range from 7 to 100 μs for said semiconductor device having a blocking voltage of 4.5 kV.

18. The method of driving a semiconductor device according to claim 4 wherein:

a period of applying the bias voltage is within the range from 5 to 30 μs for said semiconductor device having a blocking voltage of 2 kV.

19. The method of driving a semiconductor device according to claim 4 wherein:

a period of applying the bias voltage is within the range from 2 to 15 μs for said semiconductor device having a blocking voltage of 1.2 kV.

20. The method of driving a semiconductor device according to claim 4 wherein:

a period of applying the bias voltage is within the range from 0.5 to 10 μs for said semiconductor device having a blocking voltage of 600 V.

* * * * *